FIG. 1
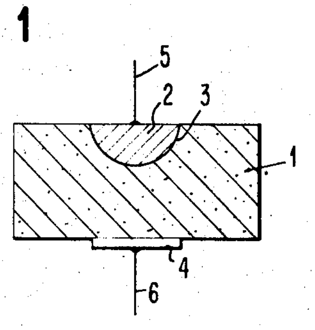
FIG. 2
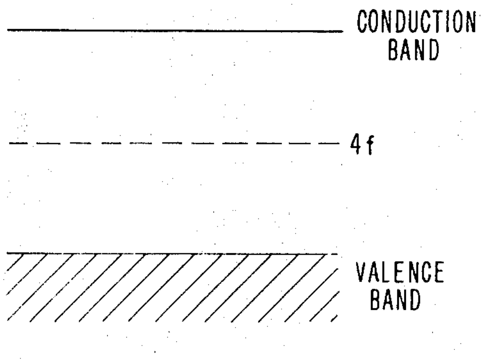
FIG. 3
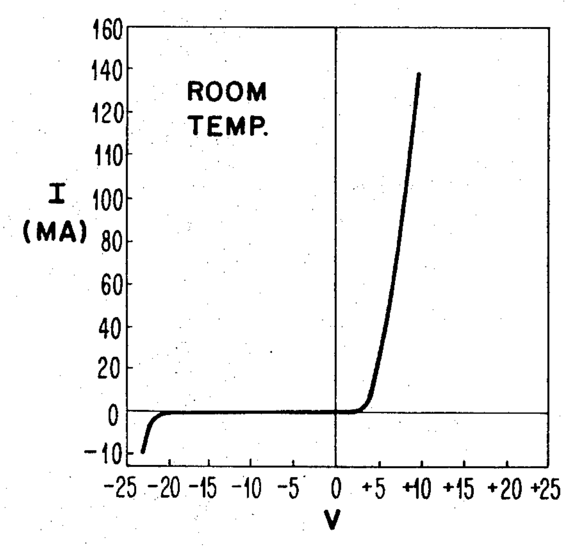
FIG. 4
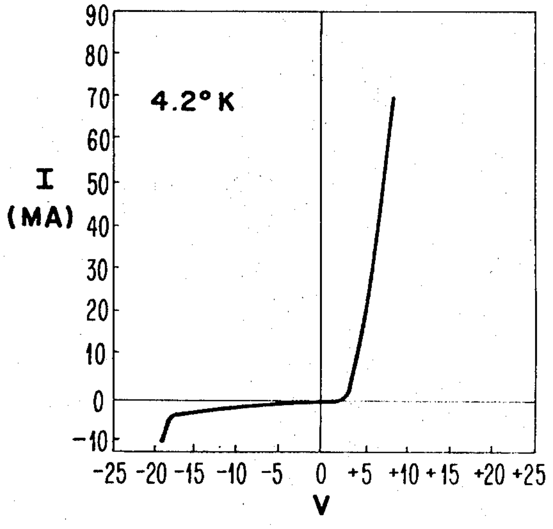
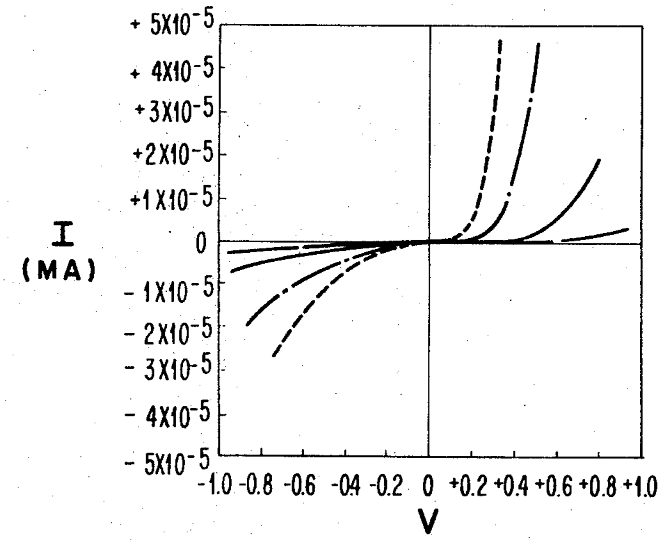
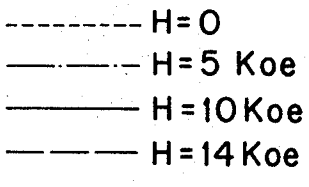
FIG. 5
~22° K
INVENTORS
FREDERIC HOLTZBERG
STEPHAN VON MOLNAR
BY [signature]
ATTORNEY United States Patent Office 3,544,865

Patented Dec. 1, 1970

3,544,865

RECTIFYING FERROMAGNETIC SEMICONDUCTOR DEVICES AND METHOD FOR MAKING SAME

Frederic Holtzberg, Pound Ridge, and Stephan von Molnar, Ossining, N.Y., assignors to International Business Machines Corporation, Armonk, N.Y., a corporation of New York Filed Dec. 20, 1968, Ser. No. 785,478
Int. Cl. H01l 3/06
U.S. Cl. 317—237 9 Claims

ABSTRACT OF THE DISCLOSURE

Ferromagnetic semiconductor devices having rectifying junctions are provided. A low melting metal, such as Pb and Sn is diffused into a semiconductor body, normally n-type, having the general formula $Eu_{1-x}RE_xA$ where RE is a trivalent rare earth element and A is a chalcogen selected from O, S, Se, and Te. An ohmic contact is affixed to the surface opposite the diffused metal and conducting leads are soldered at both surfaces.

BACKGROUND OF THE INVENTION

Field of the invention

The invention relates to ferromagnetic semiconductor devices having rectifying junctions therein and to a method of preparing the same.

Description of the prior art

Rare earth chalcogenide compositions have become increasingly important in the fields of ferromagnetic semiconductors, thermoelectric devices, magneto-optical devices, magnetoresistive devices and the like. However, these materials have not been fully exploited, especially in their use as ferromagnetic semiconductors and as magnetoresistive devices. This is because workers in the field have been unable, until now, to provide such devices having rectifying functions therein.

U.S. Pat. No. 2,978,661 to James F. Miller et al. and filed on Mar. 3, 1959, describes semiconductor devices having rectifying junctions therein. The semiconductor materials used in the above patent are selenides and tellurides of trivalent rare earth elements, such as yttrium (Y), lanthanum (La), gadolinum (Gd) and erbium (Er) and are paramagnetic. In order to establish rectifying junctions in these materials, it is proposed to dope the materials which a dopant such as, copper to establish a p-type region within the normally n-type semiconductor material.

While the disclosed method of establishing rectifying junctions in materials of the above stated Pat. No. 2,978,-661, may be useful therein. It is found to be inoperable when used to provide rectifying junctions in materials contemplated in this invention, viz., 1:1 divalent europium (Eu) chalcogenides doped with a trivalent rare earth elements. Normally, in establishing p-type regions in semiconductor materials, the semiconductor is doped with an element having a valence less than the metal ion of which the material is composed, as in the above stated Pat. No. 2,978,661. However, these standard methods cannot be applied to the 1:1 divalent Eu chalcogenides. In the 1:1 divalent Eu chalcognenides the 4*f* energy level lies in the forbidden gap, i.e. between the conduction band and the valence band as shown in FIG. 1. Thus, when an element having a valence less than $Eu^{++}$, e.g. $Na^{+}$, an electron from the 4*f* level is caused to leave the 4*f* level and migrate to the valence band and in doing so will change the valence of $Eu^{++}$ to $Eu^{+++}$. Further, because the 4*f* levels are localized, conduction is not likely to occur therein. On the other hand, if a divalent element such as $Cu^{++}$ is used as dopant in $Eu^{++}$ chalcognenides, it is believed that the $Cu^{++}$ will be substituted in the lattice for $Eu^{++}$. Thus, it is seen that the methods of prior art for establishing rectifying junctions are not applicable in the materials contemplated in this invention.

SUMMARY OF THE INVENTION

Applicants have discovered a method for providing a rectifying junction in a ferromagnetic semiconductor body. A metal such as Pb and Sn is diffused into a semiconductor body comprising a composition having the general formula $Eu_{1-x}RE_xA$ where RE is a trivalent rare earth element, e.g. La, Ce, Pr, Nd, Cd, Tb, Dy, Ho, Er, Tm, Lu, Y, and Sc and where $x$ is greater than 0 and no greater than 1. An ohmic contact is affixed to the surface opposite that of the diffused metal. Conducting leads are then attached to these surfaces to provide a ferromagnetic semiconductor device. The devices so made are magneto-sensitive that is, the I–V characteristics thereof are effectively modulated by an externally applied magnetic field. These devices can, therefore, be used in any application in which there is a desire to control or sense magnetic fieds for example, in nuclear magnetic resonance instruments. Additionally, these devices may be used as magnetic record and write heads or as semiconductor diodes in the usual semiconductor circuitry.

OBJECTS OF THE INVENTION

An object of the invention is to provide a ferromagnetic semiconductor device having rectifying junctions therein. Another object of the invention is to provide a method of preparing ferromagnetic semiconductor devices having rectifying junctions therein.

The foregoing and other objects, features and advantages of the invention will be apparent from the following more particular description of preferred embodiments of the invention, as illustrated in the accompanying drawings.

DESCRIPTION OF THE DRAWINGS

FIG. 1 is a diagrammatical view of the positions of the 4*f* energy level of the compositions used in this invention.

FIG. 2 is a cross-sectional view of a typical ferromagnetic semiconductor rectifying device, according to the present invention.

FIG. 3 is a curve depicting the I–V characteristic of a device of this invention at room temperature.

FIG. 4 is a curve depicting the I–V characteristic of the same device at 4.2° K.

FIG. 5 is a series of curves depicting the effect of I–V characteristics of a device of this invention under the influence of differing magnetic fields.

DESCRIPTION OF THE PREFERRED EMBODIMENTS

According to this invention, rectifying junctions are established in ferromagnetic semiconductor bodies having the general formula $Eu_{1-x}RE_xA$, where RE is a trivalent rare earth element selected from La, Ce, Pr, Nd, Gd, Tb, Dy, Ho, Er, Tm, Lu, Y, and Se, A is selected from O, S, Se, and Te and where $x$ is greater than 0 and no greater than 1. These materials are prepared and characterized according to the method disclosed in U.S. Pat. No. 3,371,041 to F. Holtzberg et al. filed on June 11, 1964 and assigned to the same assignee as is this application. In general, the method disclosed in the above stated Pat. No. 3,371,041 incorporated herein, requires that a mixture consisting of a 1:1 divalent rare earth chalcogenide and a 1:1 trivalent rare earth chalcogenide is heated to a temperature and for a time sufficient for a reaction to occur there between. These materials thusly formed, have n-type conductance. It has been found here that a rectifying junction region can be established in these semiconductor materials by the diffusion of either metallic lead (Pb) or tin (Sn) into the body of the semiconductors. It is believed that in the region of diffusion, the Pb or Sn react with the chalcogen to form the Pb or Sn chalcogenide, and that it is this compound that provides for the rectifying character of the diffusion region.

Conducting leads are affixed to the diffusion region by soldering a conducting lead wire to said region with a low melting solder. Ohmic contacts are affixed to the surface opposite that of the diffusion region according to the methods disclosed in co-pending patent applications Ser. Nos. 760,866 and 760,900 filed Sept. 19, 1968, in the names of F. Holtzberg, and, R. J. Gambino, and S. von Molnar respectively, and assigned to the same assignee as this invention. The methods disclosed in the above copending applications are incorporated herein.

In the above stated copending applications, the ohmic contacts are affixed to the ferromagnetic semiconductor body by diffusing a material such as a 1:1 trivalent rare earth chalcogenide or an alloy of a trivalent rare earth metal and an electrically conducting metal into said body. Because of the metallic nature of the diffused material, conducting leads can be attached directly to the diffusion region.

In the preferred embodiments of the invention, devices of the type shown in FIG. 2 are prepared. The devices have a ferromagnetic semiconductor body, 1, having a general formula $Eu_{1-x}RE_xA$, where RE is a trivalent element selected from La, Ce, Pr, Nd, Gd, Tb, Dy, Ho, Er, Tm, Lu, Y, and Sc, A is a chalcogen selected from O, S, Se, and Te and where $x$ is greater than 0 and no greater than 1, is placed on a conventional strip heater in an enclosure. A dot of an electroding material selected from a 1:1 trivalent rare earth chalcogenide such as the sulfide, selenide or telluride of a metal selected from the group consisting of La, Ce, Pr, Nd, Gd, Tb, Dy, Ho, Er, Tm, Lu, Y, and Sc, is vapor deposited onto the body 1, Alternatively, an alloy of a rare earth metal such as La, Ce, Pr, Nd, La, Gd, Tb, Dy, Ho, Er, Tm, Y, and Lu and a meal selected from Au, Ag, Cu, Zn, Ni, Co, Pd, and Pt, is deposited on said upturned surface. The body, 1, is heated to cause one of the above compositions to diffuse into said body, according to the method disclosed in the above identified patent applications Ser. Nos. 760,866 and 760,900. Heating is at a temperature of from about 300° C. to about 1000° C. and for a time from about 15 minutes to about 60 minutes depending upon which of the above electroding materials are used. An ohmic contact, 4, is thusly prepared.

The body, 1, is then turned over so that surface opposite that of the ohmic contact is in an upward position. A dot of a metal selected from Pb and Sn is placed on the body's, 1, upper surface. In a typical preparation a dot of Pb or Sn weighing about 2 mg. is placed on a body measuring about 2 mm. x 2 mm. x 1 mm. The body, 1, with its metal dot is again heated on the conventional strip heater in an inert atmosphere, e.g. helium or argon atmospheres, until the metal dot melts and wets the surface of the body. Heating is at a temperature range of from about 200° C. to 450° C., the lower temperature is selected based on the melting point of the metal used. For example, if Pb is the chosen metal, the lower heating temperature is about 327° C., the melting point of Pb. On the other hand, if Sn is the metal used, the lower heating temperature is about 230° C. The time of heating is about 1 minute to about 5 minutes. On cooling, a rectifying junction, 3, is established between a conductance region, 2, and the body, 1. Conducting leads, 5, and 6, are then soldered to the p-type diffusion region, 2, and to the ohmic contact, 4, with a suitable low melting solder. For example, indium solder or alloys thereof may be used.

The invention is further illustrated by the following preferred embodiments.

EXAMPLE 1

In one preferred embodiment of the invention a rare earth chalcogenide body having a composition represented by the formula $Eu_{0.95}Gd_{0.5}S$ is placed on a strip heater which is situated within an enclosure. A small amount, about 0.01 gram, of an alloy comprising about 76% by weight La and 24% by weight of Ag is placed on the upward surface of said $Eu_{0.95}Gd_{0.5}S$ body. The body is heated to a temperature of at least 518° C., in an argon atmosphere to cause the La-Ag alloy to melt. Heating is continued for about 15 minutes to cause the alloy to partially diffuse into the rare earth chalcogenide body to form an ohmic contact thereon. The body is then turned over on its opposing side so that the ohmic contact is facing downwardly. A dot of Sn weighing about 2 mg. is placed on the upwardly facing surface of the body. The body is again heated, this time to a temperature of at least the melting temperature of Sn, i.e. 232° C. Heating is continued for about 5 minutes in a helium atmosphere to diffuse said Sn into upper surface of the body. On cooling, a rectifying junction is established at the interface of the diffused Sn and the remainder of the body. Conducting leads, e.g. Cu then are attached at the ohmic contact and Sn diffusion regions. Conventional solders such as In and alloys thereof are used for attaching the leads.

EXAMPLE 2

A ferromagnetic semiconductor body having the formula $Eu_{0.95}Gd_{0.5}Se$ is placed on a substrate and masked. The substrate and body are then positioned about 14 inches above the evaporant source material, GdSe, in a conventional electron beam gun evaporator.

The source material is heated to a temperature in the range of about 2000° C. to about 2600° C. for about 1 minute to cause the GdSe to evaporate and deposit upon the exposed area of the body. After the deposition of GdSe on the body, the body is removed from the evaporator and placed in a sealed crucible together with about 0.1 gram of Eu metal. The crucible and its contents is then heated in an oven at a temperature of about 1000° C. for 1 hour after which the electroded body is removed and placed on a strip heater with its electroded surface facing downwardly. A dot of Pb, weighing about 0.1 of a gram, is placed on the upward surface of the body. The body is heated to a temperature of about 330° C. in an argon atmosphere for about 5 minutes. The body is cooled and conducting leads, (Cu) are attached to the Pb and GdSe diffusion regions to provide a rectifying ferromagnetic semiconductor device.

Other illustrative examples of the invention are given in the ensuing table.

For the following examples 3–16, the methods of Examples 1 or 2 are repeated, depending upon whether a rare earth metal conducting metal alloy or a 1:1 trivalent rare earth chalcogenide composition is used as the ohmic contact composition. Further different ferromagnetic semiconductor materials are used.

TABLE 1

| Number | Semiconductor composition | Ohmic contact composition | Diffusion metal |
|---|---|---|---|
| 3 | $Eu_{0.9}La_{0.1}Se$ | LaSe | Sn |
| 4 | $Eu_{0.85}Gd_{0.5}Te$ | GdTe | Pb |
| 5 | $Eu_{0.9}Tb_{0.1}Se$ | TbSe | Sn |
| 6 | $Eu_{0.9}Dy_{0.1}Se$ | 88.5% La and 1.5% Zn | Pb |
| 7 | $Eu_{0.9}Lu_{0.1}Se$ | 84.0 % and 16.0% Ni | Sn |
| 8 | $Eu_{0.9}Ho_{0.1}Se$ | HoSe | Pb |
| 9 | $Eu_{0.8}Tm_{0.2}Se$ | 82.5% Pr and 17.5% Cu | Sn |
| 10 | $Eu_{0.8}Tm_{0.2}Se$ | TmSe | Pb |
| 11 | $Eu_{0.95}La_{0.05}O$ | LaS | Sn |
| 12 | $Eu_{0.95}La_{0.05}O$ | 84% La and 16% Co | Pb |
| 13 | $Eu_{0.8}Ce_{0.2}O$ | CeSe | Sn |
| 14 | $Eu_{0.9}Nd_{0.1}O$ | 82.5% Pr and 17.5% Cu | Pb |
| 15 | $Eu_{0.85}Y_{0.15}O$ | YS | Sn |
| 16 | $Eu_{0.9}Sc_{0.1}O$ | ScTe | Pb |

The I–V characteristics of the devices of this invention are determined by conventional means. Measurements are made at room temperature and at 4.2° K. It is seen in FIGS. 3 and 4 that the I–V characteristics of a typical device measured at the above temperatures show similar rectifying behavior. FIG. 5 represents the magnetic field dependence of the I–V characteristics near the ferromagnetic ordering temperature of the bulk crystal, which in this case was prepared from a composition having the formula $Eu_{0.95}Gd_{0.5}S$ with a Pb-rich diffusion region. No magnetic field dependence is observed substantially above the ferromagnetic Curie temperature of the composition.

In summary, ferromagnetic semiconductor devices have been described whose I–V characteristics disclosed rectifying behavior. The devices are prepared by establishing a rectifying junction in a semiconductor body having the general formula $Eu_{1-x}RE_xA$. The rectifying junction is established by diffusing either Pb or Sn into semiconductor body.

While the invention has been particularly shown and described with reference to the preferred embodiments thereof, it will be understood by those skilled in the art that various changes in form and details may be made therein without departing from the spirit and scope of the invention.

What is claimed is:

1. A ferromagnetic semiconductor device, comprising a body of n-type conductivity having a composition of the general formula $Eu_{1-x}RE_xA$ where RE is a trivalent rare earth element selected from the group consisting of La, Ce, Pr, Nd, Gd, Tb, Dy, Ho, Er, Pm, Lu, Y, and Sc, $x$ is greater than 0 and no greater than 1, and where A is selected from the group O, S, Se, and Te, a diffused conductance region in said body; a rectifying junction at the interface between said conductance region and said n-type body and contact means in electrical contact with said conductance region and said n-type body.

2. A ferromagnetic semiconductor device according to claim 1 wherein said conductance region comprises a diffused metal selected from the group consisting of Pb and Sn.

3. A ferromagnetic semiconductor device according to claim 1 wherein said conductance region comprises diffused Pb.

4. A ferromagnetic semiconductor device according to claim 1 wherein said conductance region comprises diffused Sn.

5. A method for preparing a ferromagnetic semiconductor device having a conductance region and a rectifying junction therein comprising the steps of:

(a) providing a ferromagnetic semiconductor body of n-type conductivity having a general formula $Eu_{1-x}RE_xA$ where RE is selected from the group consisting of La, Ce, Pr, Nb, Gd, Tb, Dy, Ho, Er, Tm, Lu, Y, and Sc, where A is selected from the group consisting of O, S, Se, and Te and where $x$ is greater than 0 and no greater than 1, (b) affixing an ohmic contact to a first surface of said semiconductor body, (c) depositing on a second surface of said body of n-type conductivity, the second surface being opposite that to which said ohmic contact is affixed, a metal selected from the group consisting of Pb and Sn, (d) heating said body at a temperature and for a time sufficient to cause said metal to melt and diffuse into said body thereby forming a diffused conductance region and said rectifying junction between said region and said semiconductor body of n-type conductivity.

(e) affixing conducting leads to said ohmic contact and to the surface of said conductance region.

6. A method for preparing a ferromagnetic semiconductor device according to claim 5 wherein said heating is at a temperature of from about 230° C. to about 450° C.

7. A method for preparing a ferromagnetic semiconductor device according to claim 5 wherein said heating is for about 1 minute to about 5 minutes.

8. A method for preparing a ferromagnetic semiconductor device according to claim 5 wherein said deposited metal is Pb.

9. A method for preparing a ferromagnetic semiconductor device according to claim 5 wherein said deposited metal is Sn.

References Cited

UNITED STATES PATENTS

| | | | |
|---|---|---|---|
| 2,976,505 | 3/1961 | Ichikawa | 338—22 |
| 2,978,661 | 4/1961 | Miller et al. | 338—22 |
| 3,399,957 | 9/1968 | Shafer | 252—62.51X |
| 3,371,041 | 2/1968 | Holtzberg et al. | 252—62.51 |
| 3,371,042 | 2/1968 | McGuire et al. | 252—62.51 |

JAMES D. KALLAM, Primary Examiner

U.S. Cl. X.R.

252—62.51; 317—234; 29—576

PO-1050
(5/69)

UNITED STATES PATENT OFFICE
CERTIFICATE OF CORRECTION

Patent No. 3,544,865 (785,478) Dated December 1, 1970

Inventor(s) FREDERIC HOLTZBERG ET AL

It is certified that error appears in the above-identified patent and that said Letters Patent are hereby corrected as shown below:

Column 4, Table 1, line 69, Number 6:

"1.5%" should read --11.5%--

Signed and sealed this 16th day of May 1972.

(SEAL)
Attest:

EDWARD M.FLETCHER, JR.
Attesting Officer

ROBERT GOTTSCHALK
Commissioner of Patents